United States Patent
Li et al.

(10) Patent No.: US 10,804,262 B2
(45) Date of Patent: Oct. 13, 2020

(54) COINTEGRATION OF FET DEVICES WITH DECOUPLING CAPACITOR

(71) Applicant: International Business Machines Corporation, Armonk, NY (US)

(72) Inventors: Juntao Li, Cohoes, NY (US); Kangguo Cheng, Schenectady, NY (US); Yi Song, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/283,333

(22) Filed: Feb. 22, 2019

(65) Prior Publication Data
US 2020/0273857 A1    Aug. 27, 2020

(51) Int. Cl.
| | |
|---|---|
| *H01L 21/02* | (2006.01) |
| *H01L 27/07* | (2006.01) |
| *H01L 27/092* | (2006.01) |
| *H01L 23/522* | (2006.01) |
| *H01L 21/8238* | (2006.01) |
| *H01L 49/02* | (2006.01) |

(52) U.S. Cl.
CPC .... *H01L 27/0733* (2013.01); *H01L 21/02603* (2013.01); *H01L 21/823814* (2013.01); *H01L 21/823821* (2013.01); *H01L 21/823885* (2013.01); *H01L 23/5223* (2013.01); *H01L 27/0924* (2013.01); *H01L 28/40* (2013.01)

(58) Field of Classification Search
CPC ....... H01L 21/02603; H01L 21/823814; H01L 21/823821
See application file for complete search history.

(56) References Cited

U.S. PATENT DOCUMENTS

| | | |
|---|---|---|
| 6,140,693 A | 10/2000 | Weng et al. |
| 7,820,505 B2 | 10/2010 | Brederlow et al. |
| 7,939,415 B2 | 5/2011 | Richter |
| 8,946,019 B2 | 2/2015 | Chumakov et al. |
| 9,455,250 B1 | 9/2016 | Cheng et al. |
| 9,929,246 B1 | 3/2018 | Cheng et al. |
| 9,966,428 B2 | 5/2018 | Zhou et al. |
| 2009/0194844 A1 | 8/2009 | Richter |
| 2011/0018095 A1 | 1/2011 | Booth, Jr. et al. |
| 2017/0213820 A1* | 7/2017 | Balakrishnan ...... H01L 27/0629 |
| 2018/0097059 A1 | 4/2018 | Bi et al. |
| 2018/0197965 A1 | 7/2018 | Adusumilli et al. |
| 2018/0233398 A1 | 8/2018 | Van Cleemput et al. |

FOREIGN PATENT DOCUMENTS

EP     0377502 A1     7/1990

OTHER PUBLICATIONS

A. Saeidi et al., "Negative Capacitance Field Effect Transistors; Capacitance Matching and non-Hysteretic Operation," 47th European Conference: Solid-State Device Research Conference (ESSDERC), Sep. 11-14, 2017, pp. 78-81.

* cited by examiner

*Primary Examiner* — Trang Q Tran
(74) *Attorney, Agent, or Firm* — Vazken Alexanian; Ryan, Mason & Lewis, LLP (57) ABSTRACT

A semiconductor structure includes a decoupling capacitor on a semiconductor substrate. The decoupling capacitor includes a multilayer stack structure having one or more active regions on a top surface thereof. The semiconductor structure further includes one or more semiconductor devices on the one or more active regions on the decoupling capacitor.

20 Claims, 11 Drawing Sheets

COINTEGRATION OF FET DEVICES WITH DECOUPLING CAPACITOR

BACKGROUND

The present invention generally relates to semiconductor integrated circuits, and more particularly, to a method and structure for simultaneously forming integrated capacitors with nanosheet channel field effect transistors.

Complementary metal oxide semiconductor (CMOS) is used for constructing integrated circuits. For example, CMOS technology is used in microprocessors, microcontrollers, static RAM, and other digital logic circuits. During the operation of CMOS circuits, the power supply lines supply transient currents, which can result in voltage noise on the power supply lines. Undesired voltage fluctuations in the power supply line powering a circuit can cause noise on its internal signals.

Vertical transport field effect transistors (VFETs) are becoming viable device options for semiconductor devices such as CMOS devices beyond the so-called "seven nanometer (7 nm) node." VFET devices include fin channels with source/drain regions at ends of the fin channels, i.e., on tops and bottoms of the fins. Current flows through the fin channels in a vertical direction (e.g., perpendicular to a substrate), for example, from a bottom source/drain region to a top source/drain region. VFET devices are designed to address the limitations of horizontal device architectures, for example, by decoupling gate length from the contact gate pitch, providing a FinFET-equivalent density at a larger contacted poly pitch (CPP), and providing lower middle-of-the-line (MOL) resistance.

SUMMARY

Embodiments described herein provide methods of forming semiconductor structures. For example, one exemplary embodiment includes a method for fabricating a semiconductor structure comprising forming a decoupling capacitor on a semiconductor substrate. The decoupling capacitor comprises a multilayer stack structure having one or more active regions on a top surface thereof. The method further comprises forming one or more semiconductor devices on the one or more active regions of the decoupling capacitor.

Another exemplary embodiment includes a semiconductor structure comprising a decoupling capacitor on a semiconductor substrate. The decoupling capacitor comprises a multilayer stack structure having one or more active regions on a top surface thereof. The semiconductor structure further comprises one or more semiconductor devices on the one or more active regions on the decoupling capacitor.

These and other features, objects and advantages of the present invention will become apparent from the following detailed description of illustrative embodiments thereof, which is to be read in connection with the accompanying drawings.

DETAILED DESCRIPTION

Exemplary embodiments of the invention will now be discussed in further detail with regard to semiconductor devices and methods of manufacturing same and, in particular, to VFET devices.

CMOS technology is currently used for the manufacture of microprocessors, microcontrollers, static random access memory (SRAM) and other digital circuits. The word "complementary" refers to the fact that a typical CMOS digital circuit uses complementary pairs of hole-type (positive) and electron-type (negative) FETs, i.e., p-FETs and n-FETs, respectively. CMOS technology offers low static power consumption and high noise immunity, when compared to other digital technologies.

FinFET devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased MOL resistance.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to, FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

During the operation of CMOS circuits, the power supply lines supply transient currents, which can result in voltage noise on the power supply lines. Undesired voltage fluctuations in the power supply line powering a circuit can cause noise on its internal signals. In order to reduce the magnitude of voltage fluctuations in the power supply lines, filtering or decoupling capacitors are usually used. Decoupling capacitors can help prevent momentary drops in supply voltage. Accordingly, there is a need to a integrate a decoupling capacitor with, for example, a vertical FET device to improve performance.

An illustrative embodiment for forming a semiconductor structure will be described below with reference to FIGS. 1-11B. Note that the same reference numeral (100) is used to denote the semiconductor structure through the various intermediate fabrication stages illustrated in FIGS. 1 through 11B. Note also that the semiconductor structure described herein can also be considered to be a semiconductor device and/or an integrated circuit, or some part thereof.

Figure 1:
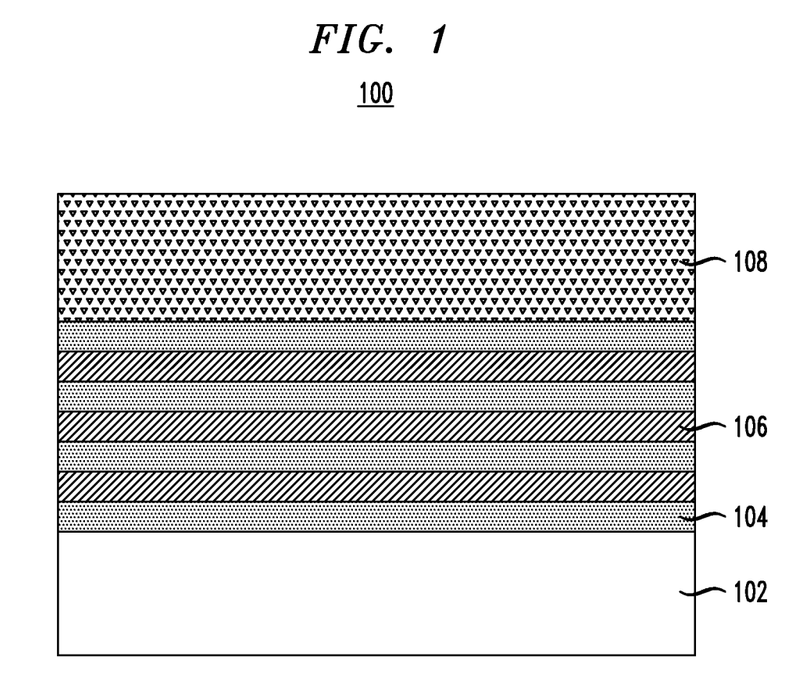
FIG. 1 is a schematic cross-sectional view illustrating stacked alternating layers and a semiconductor layer disposed on a substrate of a semiconductor device, in accordance with an illustrative embodiment.

FIG. 1 depicts a view illustrating stacked alternating layers and a semiconductor layer disposed on a semiconductor substrate in a method of manufacturing a semiconductor device, according to an exemplary embodiment of the present invention. Referring to FIG. 1, a semiconductor structure 100 comprises a semiconductor substrate 102. Semiconductor substrate 100 includes semiconductor material including, but not limited to, silicon (Si), silicon germanium (SiGe) at various Si and Ge concentrations, silicon carbide (SiC), Si:C (carbon doped silicon), silicon germanium carbide (SiGeC), carbon doped silicon germanium (SiGe:C), compounds of semiconductor materials (e.g. Groups III-V), and other like semiconductor material. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

Semiconductor structure 100 further includes alternating semiconductor layers 104 and 106 disposed on semiconductor substrate 102. In one embodiment, first semiconductor layers 104 are different than second semiconductor layers 106. First semiconductor layers 104 include, for example, doped silicon layers. In general, doped silicon layers are formed by first depositing the silicon on the substrate, e.g., by epitaxially growing the silicon layer. After the semiconductor material is grown, the semiconductor material can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant such as phosphorus (P), arsenic (As) and antimony (Sb), and a p-type dopant such as boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

Second semiconductor layers 106 include, for example, alternating layers of $Si_xGe_y$ formed by any suitable SiGe epitaxy process with graded concentrations of Si and Ge. For example, in one embodiment, $Si_xGe_y$ layers 106 can include Si in an amount of 20% to 80% and Ge in an amount of 80% to 20%. In one embodiment, $Si_xGe_y$ layers 106 includes 25% to 75% of Si and 75% to 25% of Ge. In general, the thickness of second semiconductor layers 106 can range from about 5 nanometers (nm) to about 10 nm.

In one embodiment, alternating semiconductor layers 104 and 106 can comprise two or more layers. In one embodiment, alternating semiconductor layers 104 and 106 can comprise three or more layers. In another embodiment, alternating semiconductor layers 104 and 106 can comprise four or more layers. For example, as further shown in FIG. 1, alternating semiconductor layers 104 can comprise three alternating layers, and alternating semiconductor layers 106 can comprise four alternating layers. It is to be understood that the arrangement of the multilayered stack comprising alternating semiconductor layers 104 and 106 is purely exemplary and should not be considered limiting.

Semiconductor structure 100 further includes semiconductor layer 108 disposed on the top surface of stacked alternating semiconductor layers 104 and 106. The semiconductor layer 108 includes any known semiconductor material. In general, semiconductor layer 108 is comprised of semiconductor material such as an intrinsic semiconductor material which form active regions used for device fabrication, e.g., the semiconductor layer 108 can be used for vertical device fabrication, FinFET device fabrication or conventional planar device fabrication. The semiconductor layer 108 can include an intrinsic semiconductor material such as silicon germanium, Si, silicon carbide and the like.

Figure 2A:
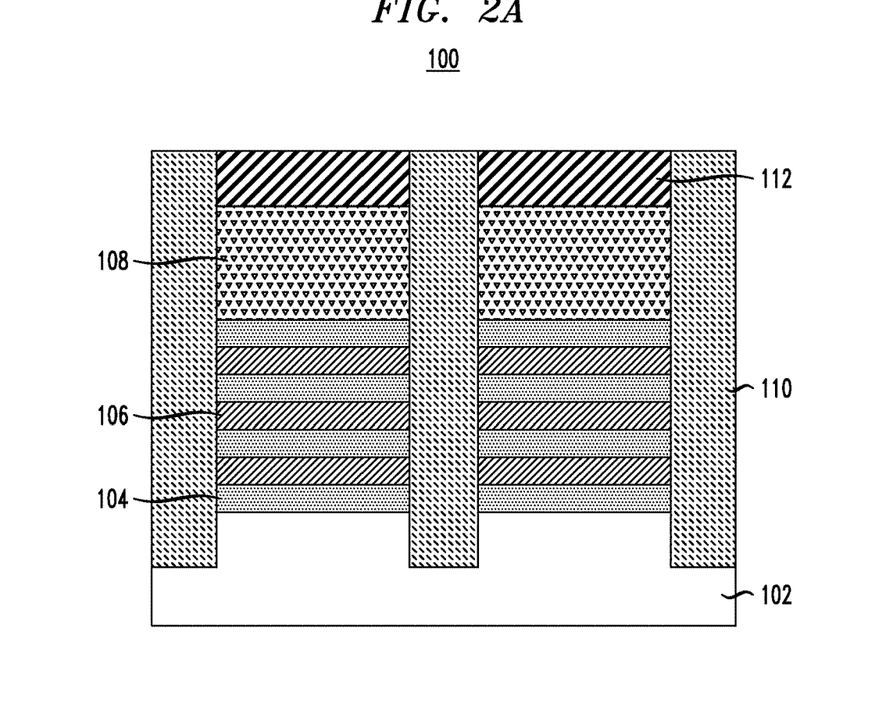
FIG. 2A is a cross-sectional view of a portion of a semiconductor device at a first-intermediate fabrication stage, in accordance with an illustrative embodiment.
Figure 2B:
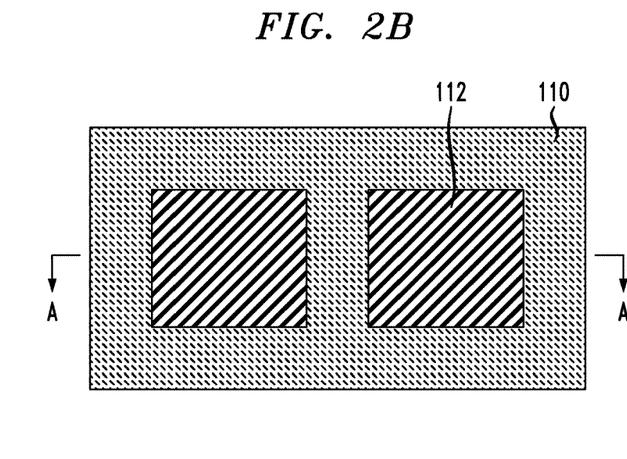
FIG. 2B is a top down view of a portion of a semiconductor device at a first-intermediate fabrication stage, in accordance with an illustrative embodiment.

FIGS. 2A and 2B illustrate views of a semiconductor structure 100 at a first-intermediate fabrication stage. FIG. 2A shows a cross sectional view of semiconductor structure 100 taken along the line A-A of FIG. 2B. FIG. 2B shows a top view of semiconductor structure 100. During this stage a hard mask film 112 is deposited on the surface of semiconductor layer 108. For illustrative purposes of the present invention, hard mask film 112 may be silicon dioxide ($SiO_2$) or silicon nitride ($Si_3N_4$). In addition, a photoresist layer (not shown) may be provided above hard mask film 112. In at least one embodiment of the present invention, hard mask film 112 can be patterned or etched by any technique known in the art to selectively remove central portion 110 and outer portions 110 of semiconductor layer 108, alternating semiconductor layers 104 and 106 and a portion of semiconductor substrate 102. For example, etching may be accomplished by etching into the substrate utilizing a conventional dry etching process such as reactive-ion etching (ME) or plasma etching. ME is a form of plasma etching in which during etching the surface to be etched is placed on a radio-frequency powered electrode. Moreover, during ME the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Next, a semiconductor material is filled in central portion 110 and outer portions 110 and to the top surface of hard mask film 112. The semiconductor material for filling central portion 110 and outer portions 110 can be the same or different semiconductor material as used for first semiconductor layers 104. Suitable semiconductor material for filling central portion 110 and outer portions 110 include, for example, doped single crystalline silicon layers or doped polysilicon or amorphous silicon layers. In general, doped single crystalline silicon layers are formed by first depositing the silicon layer in central portion 110 and outer portions 110, e.g., by epitaxially growing the silicon layer. The doped polysilicon or amorphous silicon can be deposited by a chemical vapor deposition (CVD) method. The doped polysilicon or amorphous silicon can be in-situ doped during the deposition process. Alternatively, the doped polysilicon or amorphous silicon is deposited by repeatedly depositing an undoped layer followed by a doping step. A planarization process such as a chemical mechanical planarization (CMP) is then performed to polish the surface of the semiconductor structure down to the top surface of hard mask film 112, thereby removing the overburden portions of the semiconductor material of central portion 110 and outer portions 110.

Figure 3A:
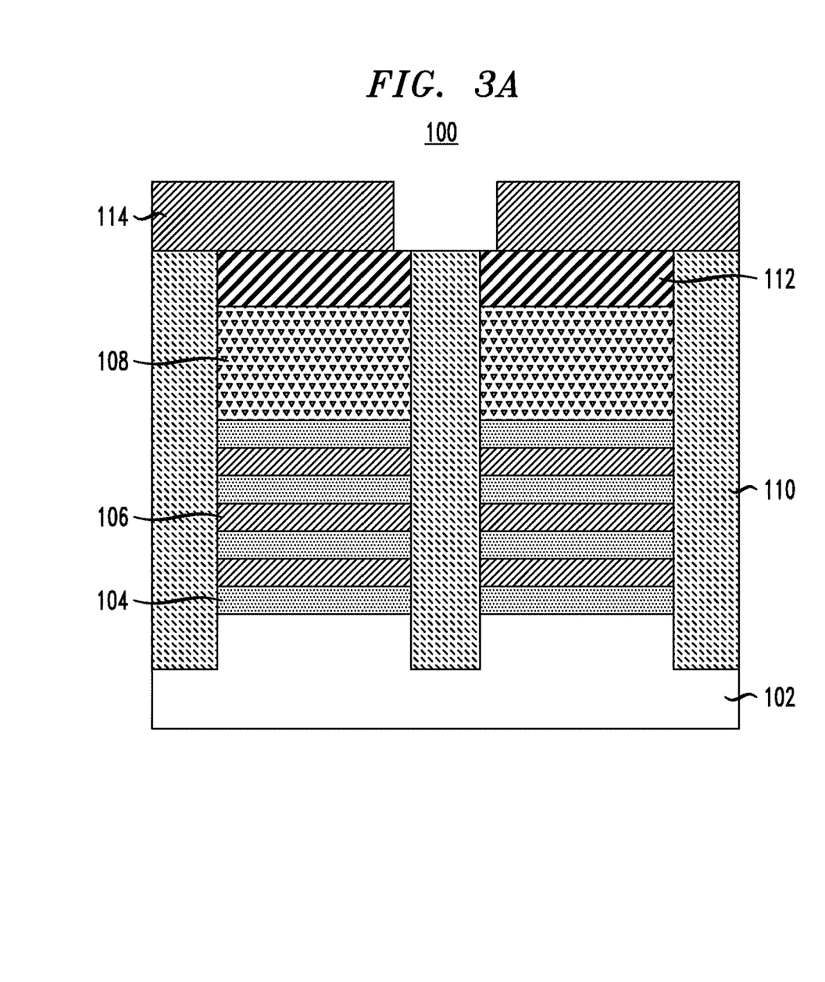
FIG. 3A is a schematic cross-sectional view of a portion of a semiconductor device at a second-intermediate fabrication stage, according to an illustrative embodiment.
Figure 3B:
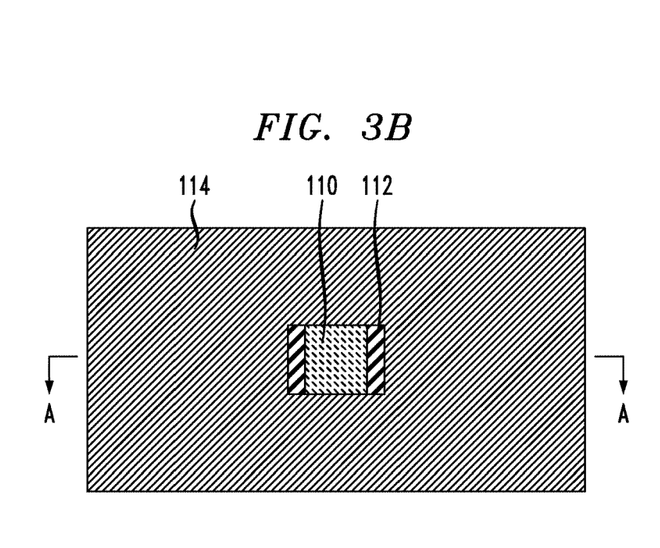
FIG. 3B is a top down view of a portion of a semiconductor device at a second-intermediate fabrication stage, in accordance with an illustrative embodiment.

FIGS. 3A and 3B illustrate views of semiconductor structure 100 at a second-intermediate fabrication stage. FIG. 3A shows a cross sectional view of semiconductor structure 100 taken along the line A-A of FIG. 3B. FIG. 3B shows a top view of semiconductor structure 100. During this stage, block mask 114 is deposited on the top surface of outer portions 110 and on a portion of hard mask film 112 leaving an opening exposing central portion 110 and a portion of hard mask film 112. Block mask 114 is deposited by methods known in the art.

Figure 4A:
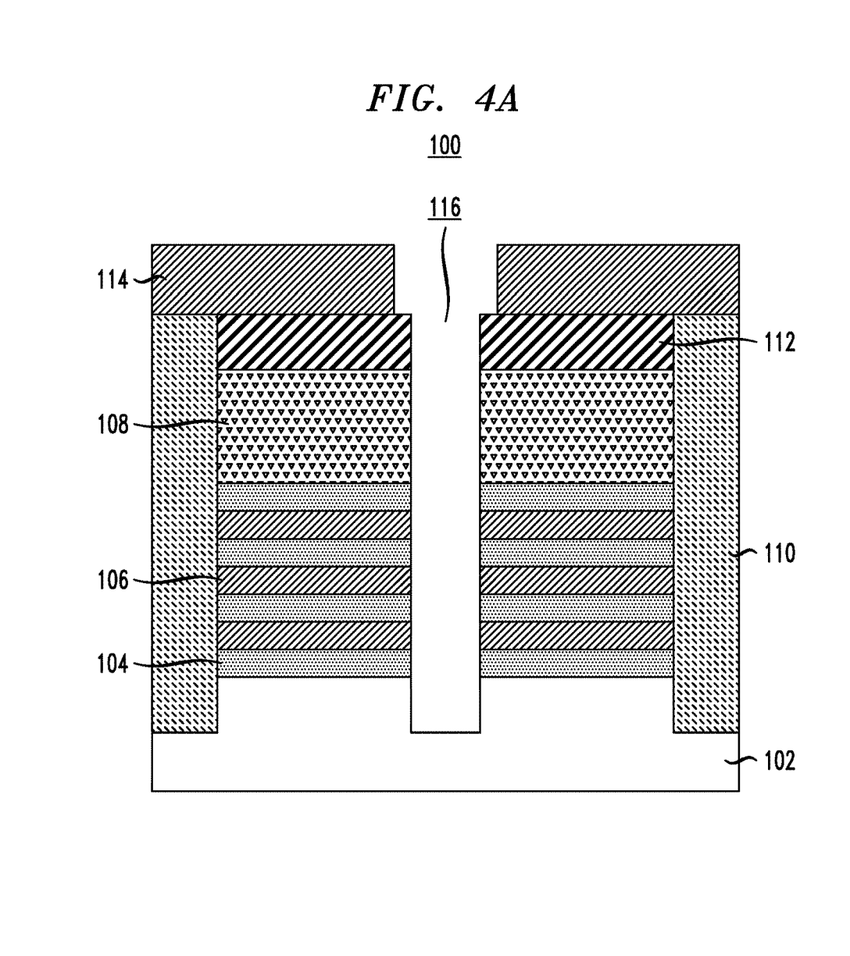
FIG. 4A is a schematic perspective view of a portion of a semiconductor device at a third-intermediate fabrication stage, according to an illustrative embodiment.
Figure 4B:
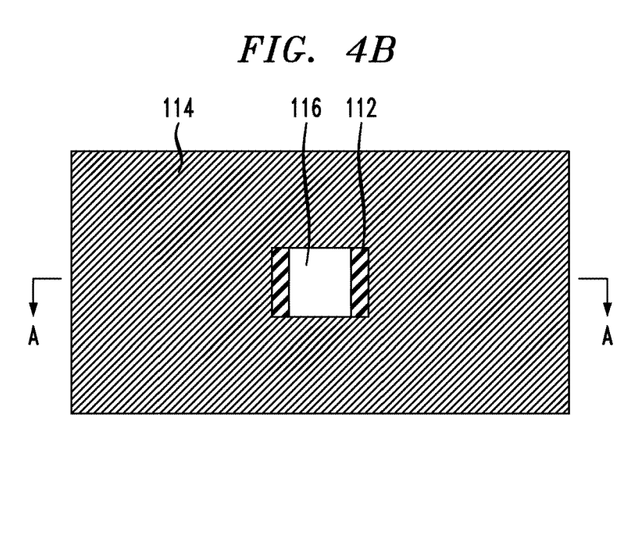
FIG. 4B is a top down view of a portion of a semiconductor device at a third-intermediate fabrication stage, in accordance with an illustrative embodiment.

FIGS. 4A and 4B illustrate views of semiconductor structure 100 at a third-intermediate fabrication stage. FIG. 4A shows a cross sectional view of semiconductor structure 100 taken along the line A-A of FIG. 4B. FIG. 4B shows a top view of semiconductor structure 100. During this stage, central portion 110 is recessed to remove semiconductor material and form opening 116. Semiconductor material of central portion 110 can be removed using directional removal techniques such as, for example, reactive ion etching (ME).

Figure 5:
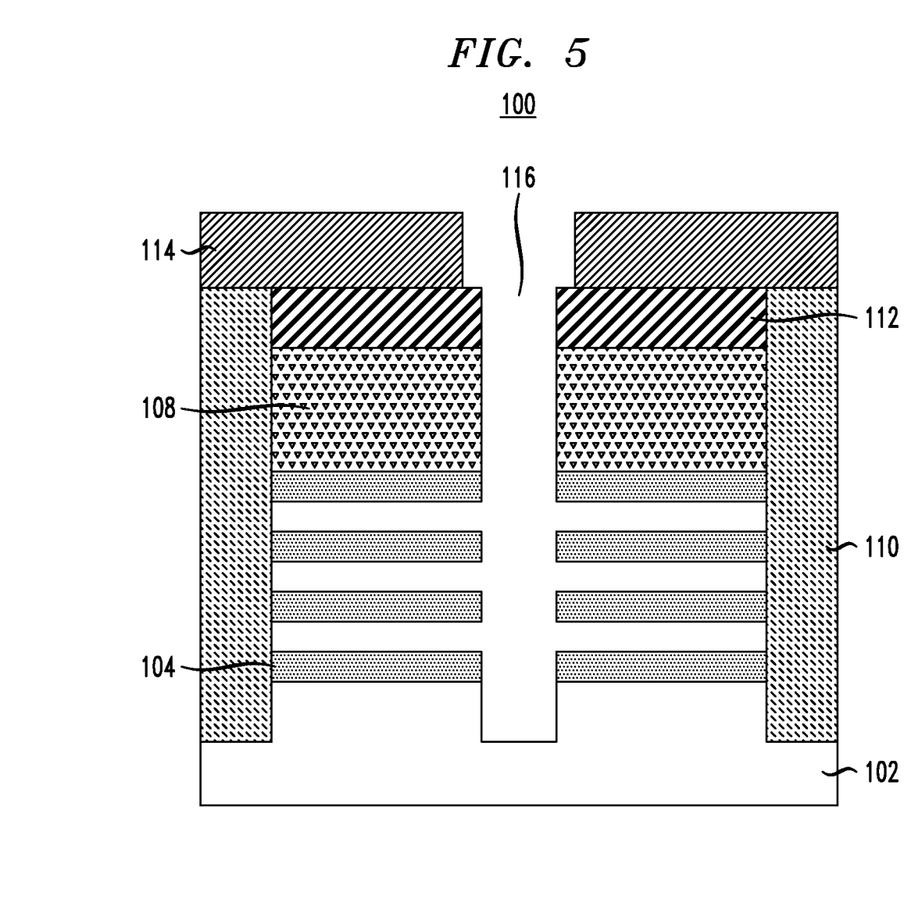
FIG. 5 is a schematic cross-sectional view of a portion of a semiconductor device at a fourth-intermediate fabrication stage, according to an illustrative embodiment.

FIG. 5 illustrates a cross-sectional view of semiconductor structure 100 at a fourth-intermediate fabrication stage. During this stage, alternating layers 106 are selectively recessed to extend opening 116 using a gas phase hydrochloric acid etch.

Figure 6A:
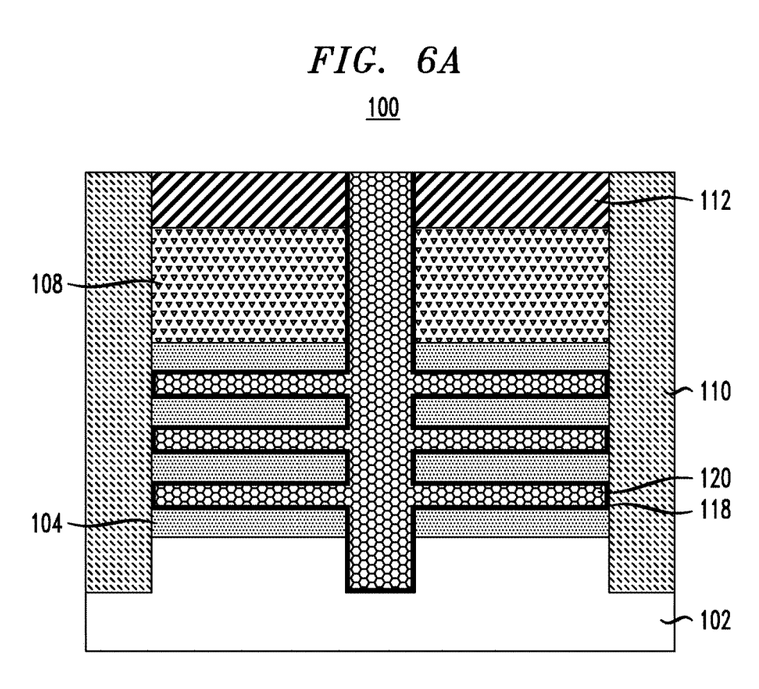
FIG. 6A is a schematic cross-sectional view of a portion of a semiconductor device at a fifth-intermediate fabrication stage, according to an illustrative embodiment.
Figure 6B:
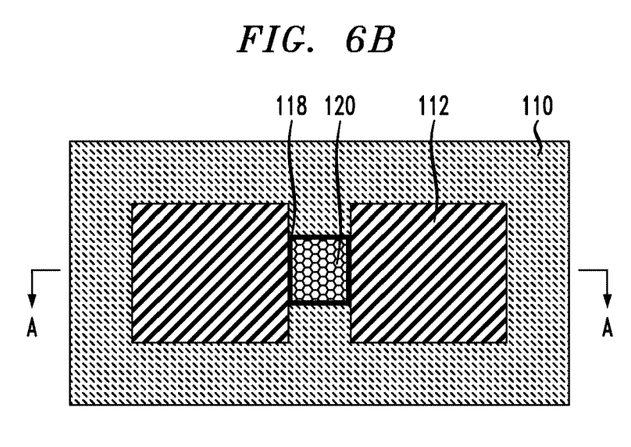
FIG. 6B is a top down view of a portion of a semiconductor device at a fifth-intermediate fabrication stage, in accordance with an illustrative embodiment.

FIGS. 6A and 6B illustrate views of semiconductor structure 100 at a fifth-intermediate fabrication stage. FIG. 6A shows a cross sectional view of semiconductor structure 100 taken along the line A-A of FIG. 6B. FIG. 6B shows a top view of semiconductor structure 100. During this stage, block mask 114 is removed, and then a conformal dielectric layer 118 is deposited on the exterior surface of opening 116. The conformal dielectric layer is formed with any suitable dielectric material including, for example, nitride, oxynitride, or oxide or a high-k dielectric material having a dielectric constant of about 3.9 or greater. The dielectric material can include high-k materials, or any combination of these materials. Suitable high-k materials include, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum and aluminum. The high-k dielectric material layer may be formed by suitable deposition processes, for example, chemical vapor deposition (CVD), physical vapor deposition (PVD), plasma enhanced chemical vapor deposition (PECVD), atomic layer deposition (ALD), chemical solution deposition or other like processes. The thickness of the high-k dielectric material may vary depending on the deposition process as well as the composition and number of high-k dielectric materials used.

A conductive material 120 is then deposited in to fill opening 116. Suitable conductive material 120 includes any conductive material known to one skilled in the art. For example, a suitable conductive material includes tantalum (Ta), tungsten (W), aluminum (Al), tantalum nitride (TaN), a doped semiconductor material such as doped polysilicon (poly-Si) and alloys thereof including metal semiconductor alloys, such as silicides and the like. The conductive layer 120 may be formed via known deposition techniques, such as ALD, CVD or PVD. It should be appreciated that a CMP process can be applied to the top surface. The conductive metal material 120 can be configured as one electrode in the buried capacitor structure as discussed below.

Figure 7A:
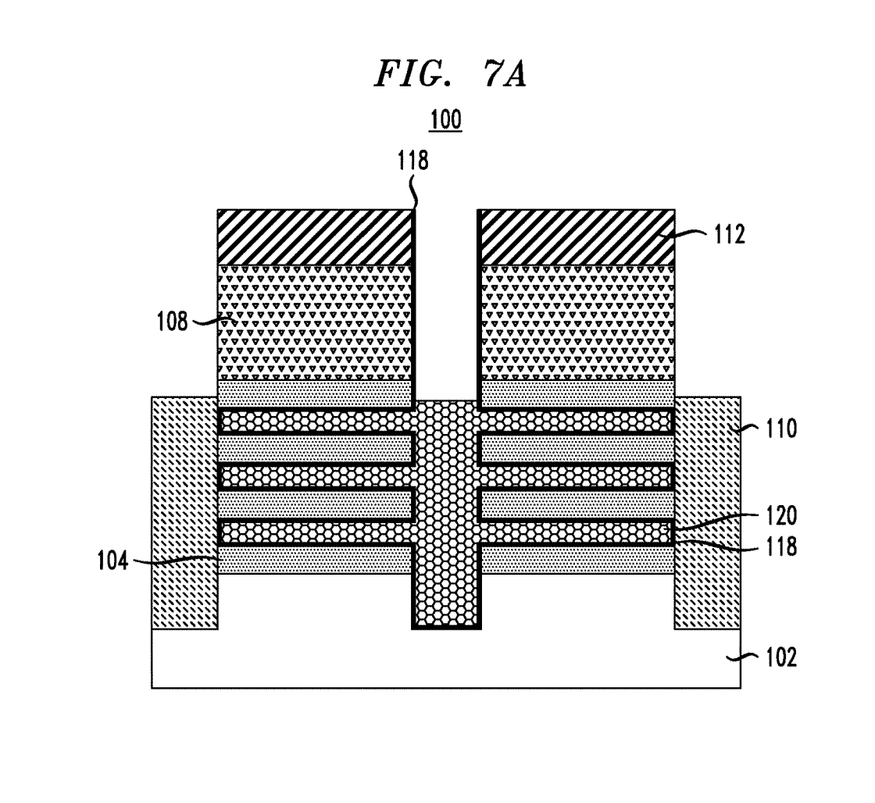
FIG. 7A is a schematic cross-sectional view of a portion of a semiconductor device at a sixth-intermediate fabrication stage, according to an illustrative embodiment.
Figure 7B:
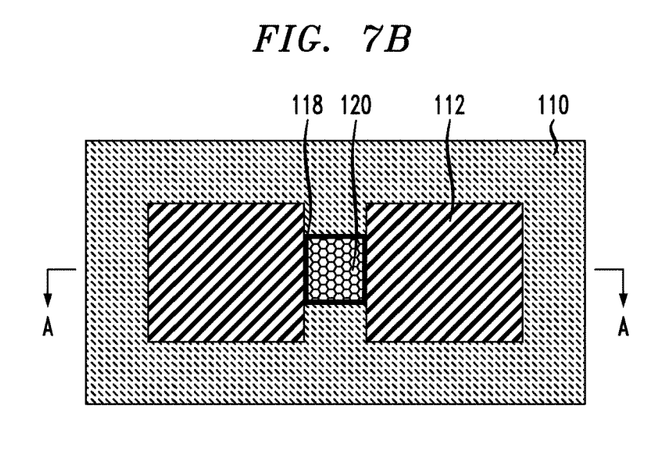
FIG. 7B is a top down view of a portion of a semiconductor device at a sixth-intermediate fabrication stage, in accordance with an illustrative embodiment.

FIGS. 7A and 7B illustrate views of semiconductor structure 100 at a sixth-intermediate fabrication stage. FIG. 7A shows a cross sectional view of semiconductor structure 100 taken along the line A-A of FIG. 7B. FIG. 7B shows a top view of semiconductor structure 100. During this stage, outer portions 110 and conductive material 120 are recessed below a top surface of the top first semiconductor layer 104 utilizing a RIE etch process with hardmask 112 in place. However, any suitable recess process (e.g., isotropic wet etch) can be used in accordance with the embodiments described herein.

Figure 8A:
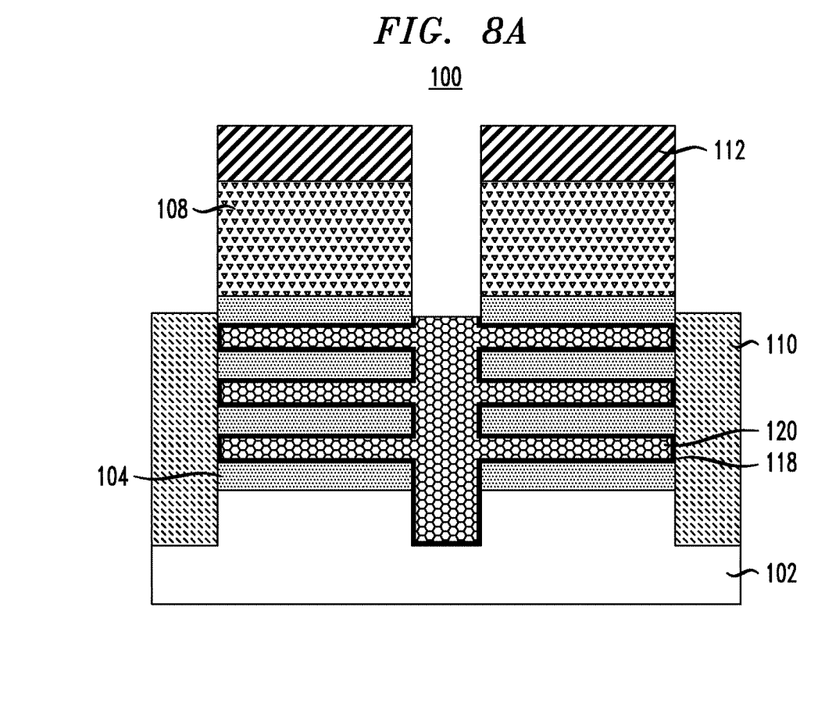
FIG. 8A is a schematic cross-sectional view of a portion of a semiconductor device at a seventh-intermediate fabrication stage, according to an illustrative embodiment.
Figure 8B:
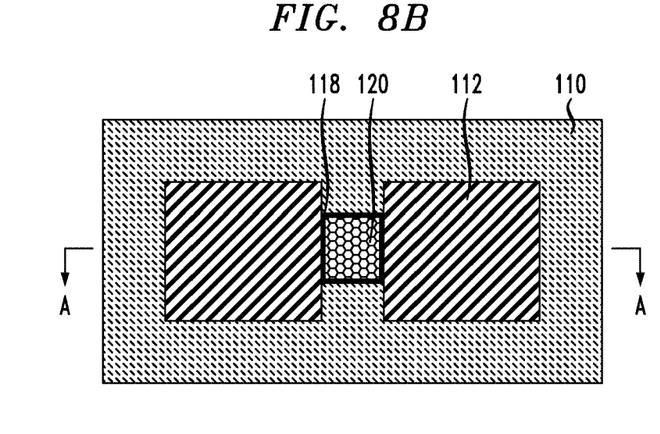
FIG. 8B is a top down view of a portion of a semiconductor device at a seventh-intermediate fabrication stage, in accordance with an illustrative embodiment.

FIGS. 8A and 8B illustrate views of semiconductor structure 100 at a seventh-intermediate fabrication stage. FIG. 8A shows a cross sectional view of semiconductor structure 100 taken along the line A-A of FIG. 8B. FIG. 8B shows a top view of semiconductor structure 100. During this stage, conformal dielectric layer 118 is selectively removed from the exterior surface of exposed first semiconductor layer 104, semiconductor layer 108 and hard mask film 112 and down to the top surface of conductive material 120. The removal of dielectric layer 118 from the first exemplary structure shown in FIG. 8A can be performed utilizing an isotropic etching process that selectivity removes the dielectric layer 118. The isotropic etch may be a wet or dry etch that is selective to the material in first semiconductor layer 104, semiconductor layer 108, hard mask film 112 and conductive material 120.

Figure 9A:
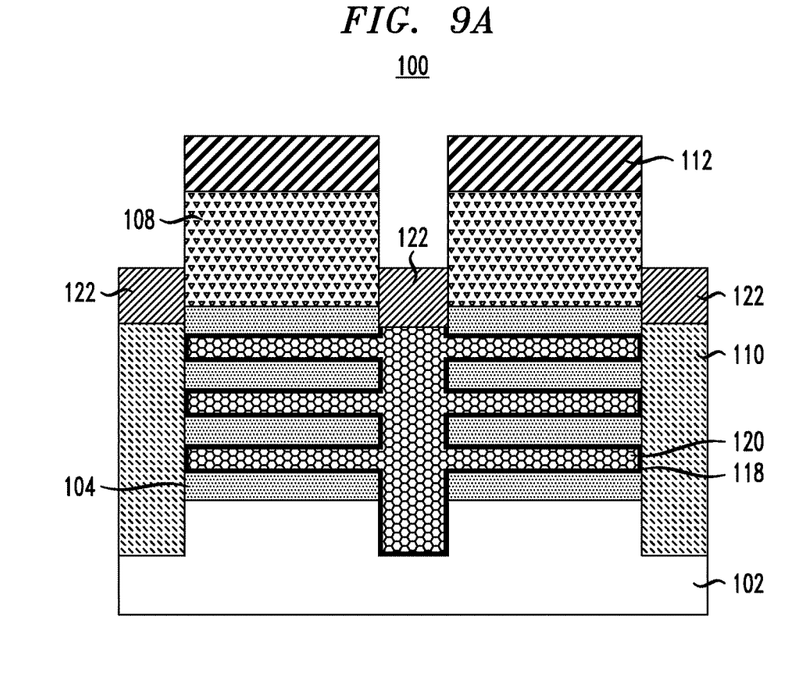
FIG. 9A is a schematic cross-sectional view of a portion of a semiconductor device at an eighth-intermediate fabrication stage, according to an illustrative embodiment.
Figure 9B:
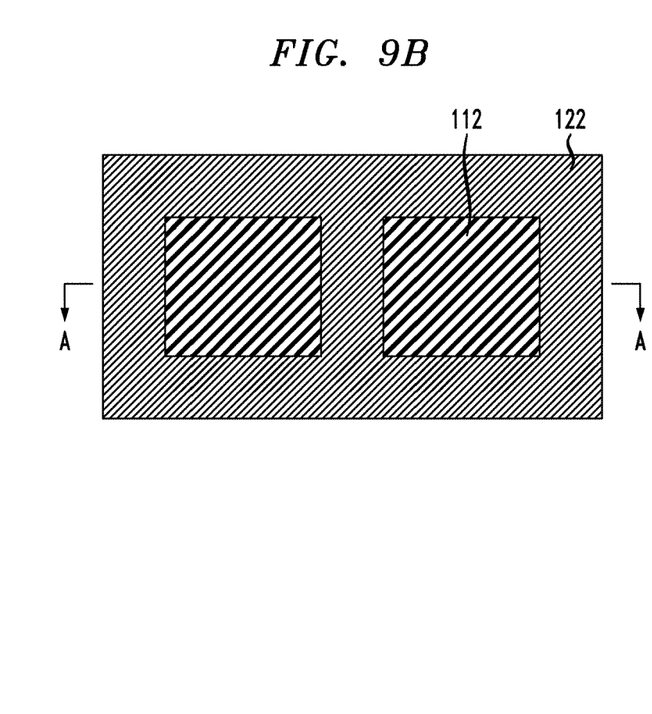
FIG. 9B is a top down view of a portion of a semiconductor device at an eighth-intermediate fabrication stage, in accordance with an illustrative embodiment.

FIGS. 9A and 9B illustrate views of semiconductor structure 100 at an eighth-intermediate fabrication stage. FIG. 9A shows a cross sectional view of semiconductor structure 100 taken along the line A-A of FIG. 9B. FIG. 9B shows a top view of semiconductor structure 100. During this stage, a shallow trench isolation (STI) oxide is then deposited on the top surfaces of outer portions 110 and conductive layer 120 forming STI regions 122. The excess STI oxide is removed via CMP followed by an oxide recess process such that the resulting STI regions 122 are coplanar and expose a portion of the exterior surfaces of semiconductor layer 108.

Figure 10A:
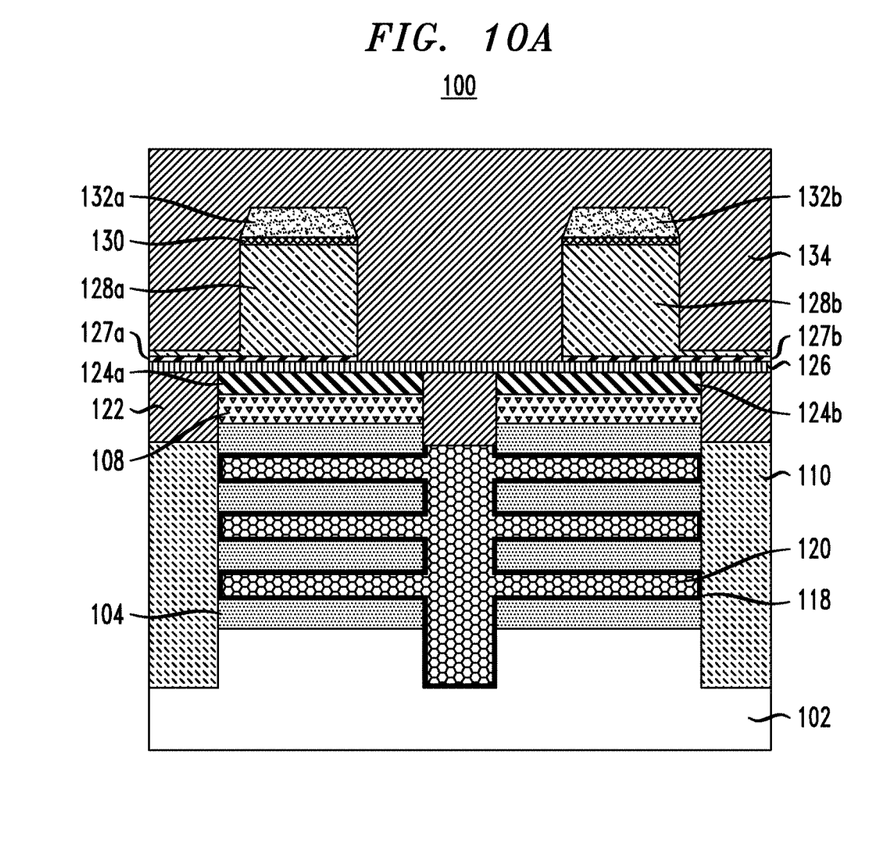
FIG. 10A is a schematic cross-sectional view of a portion of a semiconductor device taken along the fin direction within the region between two vertical fins at a ninth-intermediate fabrication stage, according to an illustrative embodiment.
Figure 10B:
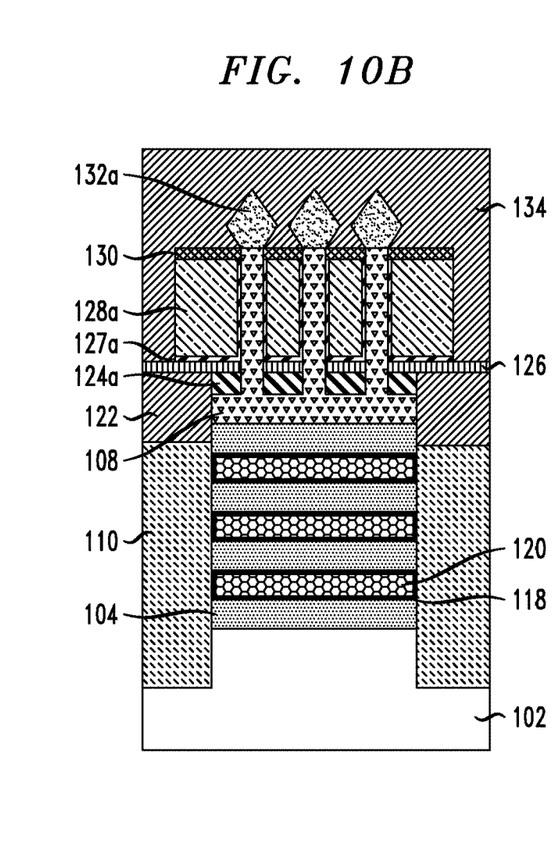
FIG. 10B is a schematic cross-sectional view of a portion of a semiconductor device perpendicular to the fin direction at a ninth-intermediate fabrication stage, in accordance with an illustrative embodiment.

Following the eighth-intermediate fabrication stage, industry standard techniques may be used to complete the fabrication of the integrated circuit (IC). In one illustrative embodiment, semiconductor structure 100 is subjected to a VFET integration process. For example, FIGS. 10A and 10B illustrate views of semiconductor structure 100 during a VFET integration process. FIG. 10A shows a cross sectional view of semiconductor structure 100 taken along the fin direction within the region between two vertical fins. FIG. 10B shows a view of semiconductor structure 100 perpendicular to the fin direction. During this stage, hard mask film 112 is removed. Next, fins can be formed by patterning the semiconductor layer 108 as known in the art. Bottom source/drain regions 124a and 124b are formed on the semiconductor layer 108 and around the fins (not shown). The bottom source/drain regions 124a and 124b can be formed by bottom-up epitaxial growth processes (with optional dummy vertical dielectric liners covering fin sidewalls during epitaxial growth), wherein the bottom source/drain regions 124a and 124b are grown in separate epitaxial processes from each other to certain height (thickness) such as, but not necessarily limited to about 10 nm to about 50 nm. The epitaxially grown bottom source/drain regions 124a and 124b can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant for one bottom source/drain region and a p-type for the other bottom source/drain region. According to an embodiment, the bottom source/drain region 124a and 124b can include a boron doped SiGe or a phosphorous doped silicon.

Referring further to FIGS. 10A and 10B, a bottom spacer layer 126 is formed on the bottom source/drain regions 124a and 124b and the STI region 122. The bottom spacer layer 126 may be deposited using a deposition process, such as chemical vapor deposition, PECVD, metal organic chemical vapor deposition (MOCVD) or other like chemical vapor deposition processes. According to an embodiment of the present invention, the bottom spacer layer 130 is deposited using, for example, directional deposition techniques, including, but not necessarily limited to, high density plasma (HDP) deposition and gas cluster ion beam (GCIB) deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, RIE. The bottom spacer layer 126 can be an insulator spacer material such as a dielectric material, which can be, for example, silicon boron nitride (SiBN), siliconborocarbonitride (SiBCN), silicon nitride, silicon oxide, silicon dioxide, silicon oxynitride, a dielectric metal oxide, a dielectric metal nitride, or a combination thereof.

Referring further to FIGS. 10A and 10B, gate metal stacks are formed next in which gate layers 128a and 128b are deposited on a gate dielectric layers 127a and 127b. In one embodiment, gate dielectric layers 127a and 127b are first deposited on bottom spacer layer 126 and include, for example, a high-K material such as HfO$_2$ (hafnium oxide), ZrO$_2$ (zirconium dioxide), hafnium zirconium oxide Al$_2$O$_3$ (aluminum oxide), and Ta$_2$O$_5$ (tantalum pentoxide). For a P-FET, the gate metal layer is a P-metal. Suitable P-metals include, for example, P-doped polysilicon, tungsten nitride (W$_2$N, WN, WN$_2$), platinum (Pt) or combination of different metals such as titanium (Ti), titanium nitride (TiN) and tungsten (W). For an N-FET, the gate metal layer is an N-metal. Suitable N-metals include, for example, N-doped polysilicon, tantalum (Ta), tantalum nitride (TaN), titanium aluminum (TiAl), titanium aluminum carbide (TiAlC), and neodymium (Nb). N-metals, like N-type semiconductors are electron donors. P-metals, like P-type semiconductors, are electron acceptors. In one example, gate metal layers are about 10 nm to about 40 nm thick. Gate metal layers 128a and 128b can be one single metal or a composition of multiple metals. The gate metal layers 128a and 128b are conformally deposited using, for example, deposition techniques including, but not limited to, CVD, PECVD, RFCVD, PVD, ALD, MLD, MBD, PLD, LSMCD, sputtering, and/or plating. The gate metal layers 128a and 128b and gate dielectric layers 127a and 127b are conformally deposited on the bottom spacer layer 126 and on and around the fins. A gate patterning process will be performed to deposit the gate metal layers 128a and 128b and gate dielectric layers 127a and 127b on top of bottom spacer layer 126.

Next, a top spacer layer 130 is formed on the gate metal stacks 128a and 128b. The top spacer layer 130 includes, for example, silicon nitride (SiN), silicon boron nitride (SiBN), siliconborocarbonitride (SiBCN), or silicon oxycarbonitride (SiOCN). According to an embodiment of the present invention, the top spacer layer 130 is conformally deposited using, for example, deposition techniques including, but not limited to, CVD, PECVD, RFCVD, PVD, ALD, MLD, MBD, PLD, LSMCD, sputtering, and/or plating.

Next, top source/drain regions 132a and 132b in the respective n-type and/or p-type region are epitaxially grown in an epitaxial growth process. The epitaxially grown top source/drain regions 132a and 132b can be formed in different epitaxial growth processes from each other and can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant and p-type dopants as discussed above. As shown in FIG. 10B, epitaxially grown top source/drain regions 132a and 132b are formed in a diamond shaped configuration. In an alternative embodiment, the top source/drain region can be merged.

Following deposition of top source/drain regions 132, a dielectric fill layer 134 is formed on semiconductor structure 100. The dielectric fill layer 134 includes, for example, silicon dioxide, flowable oxide, spin-on-glass, etc. According to an embodiment of the present invention, the dielectric fill layer 134 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Figure 11A:
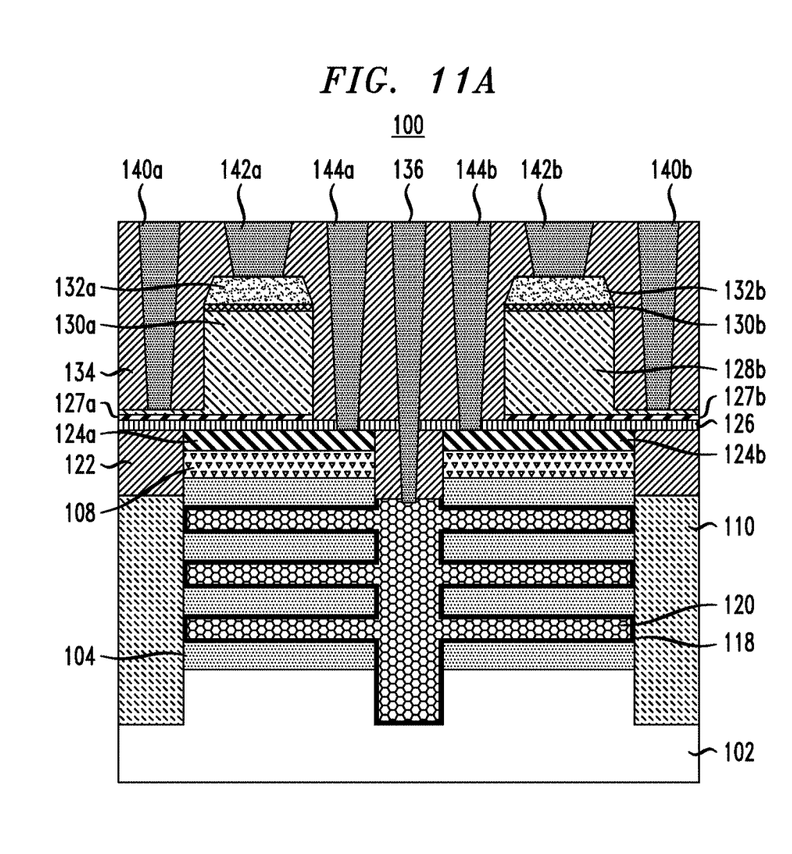
FIG. 11A is a schematic cross-sectional view of a portion of a semiconductor device at a tenth-intermediate fabrication stage, according to an illustrative embodiment.
Figure 11B:
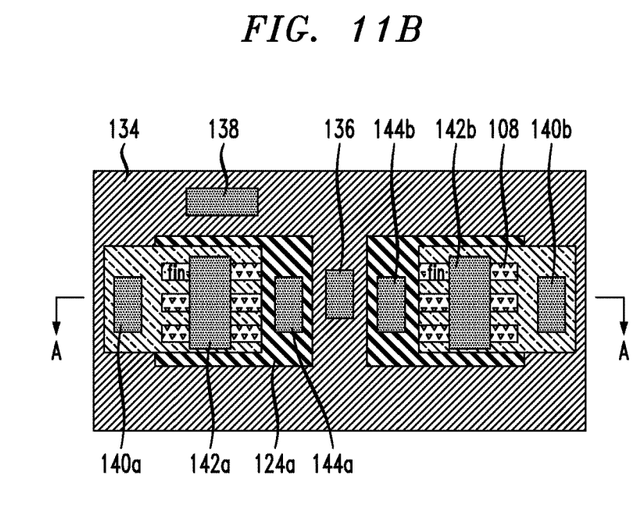
FIG. 11B is a top down view of a portion of a semiconductor device at a tenth-intermediate fabrication stage, in accordance with an illustrative embodiment.

FIGS. 11A and 11B illustrate views of semiconductor structure 100 in forming metal contacts (e.g., metal gate contacts 140a and 140b, top source/drain contacts 142a and 142b, and bottom source/drain contacts 144a and 144b for a VFET) such as two terminal electrodes for a decoupling capacitor. FIG. 11A shows a cross sectional view of semiconductor structure 100 taken along the line A-A of FIG. 11B. FIG. 11B shows a top view of semiconductor structure 100. During this stage, metal contacts including metal gate contacts 140a and 140b, top source/drain contacts 142a and 142b, and bottom source/drain contacts 144a and 144b are formed. For example, metal gate contacts 140a and 140b are an electrical connection to a gate. A circuit external to the FinFET uses metal gate contacts 140a and 140b to electrically connect a part of the circuit to a gate in the FinFET. Top source/drain contacts 142a and 142b are electrical contacts that provide electrical connectivity to a top S/D region. A circuit external to the FinFET uses top source/drain contacts 142a and 142b to electrically connect a part of the circuit to a top S/D region in a vertical FinFET. Bottom source/drain contacts 144a and 144b are an electrical contact that provides electrical connectivity to a bottom S/D region. A circuit external to the FinFET uses bottom source/drain contacts 144a and 144b to electrically connect a part of the circuit to a bottom S/D region in a vertical FinFET.

In one illustrative embodiment, conductive vias for contacts 140a and 140b communicative with metal gate stacks 130a and 130b, respectively, of the VFET device are formed. In one illustrative embodiment, conductive vias for contacts 142a and 142b communicative with top S/D regions 132a and 132b, respectively, of the VFET device are formed. In one illustrative embodiment, conductive vias for contacts 144a and 144b communicative with bottom S/D regions 124a and 124b, respectively, of the VFET device are formed. The conductive vias can be formed by methods known in the art, e.g., selectively etching through the dielectric layer 134 by, for example, RIE, such that the via is communicative with the respective component, e.g., conductive vias for contacts 140a and 140b communicative with the respective metal gate stacks 130a and 130b. A conductive material is then deposited within the via. The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

Next, electrodes 136 and 138 are formed in which electrode 136 provides electrical connection to the buried layer 104 (not shown) and electrode 138 provides electrical connection to the buried layer 110. The electrodes 136 and 138 can be formed by, for example, a photolithographic patterning and etching process that removes, for example, portions of dielectric layer 134, bottom spacer layer 126 and STI region 122 to expose a portion of conductive layer 120. Any suitable etching process can be used such as, for example, reactive ion etching. Electrode 138 can be formed in a similar manner. Since the first and second electrodes 136 and 138 can be formed by different processes at different times, the electrodes 136 and 138 may include the same or different materials. This provides additional flexibility in the design of the capacitor(s).

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor structure comprising:

forming a decoupling capacitor on a semiconductor substrate, wherein the decoupling capacitor has an active region on a top surface thereof and wherein the decoupling capacitor comprises a multilayer stack structure; and forming one or more semiconductor devices on the active region on the top surface of the decoupling capacitor;

wherein the step of forming the decoupling capacitor comprises forming the multilayer stack structure on the semiconductor substrate comprising:

forming alternating layers of a first semiconductor material and a second semiconductor material, wherein the first semiconductor material is formed on the semiconductor substrate and is a top layer of the alternating layers;

forming the active region comprising a semiconductor layer of a third semiconductor material on the top layer of the alternating layers;

forming a hard mask on the active region;

forming a central portion, a first outer portion and a second outer portion in the multilayer stack structure, wherein each of the central portion, the first outer portion and the second outer portion comprises a respective first opening, a second opening and a third opening through the hard mask, the active region, the alternating layers and a portion of the semiconductor substrate; and depositing a fourth semiconductor material in each of the respective first opening, second opening and third opening through the hard mask.

2. The method of claim 1, wherein the step of forming the decoupling capacitor further comprises:
   selectively removing the fourth semiconductor material in the central portion to form a fourth opening;
   selectively removing the second semiconductor material from the alternating layers to form a fifth opening;
   depositing a dielectric layer on the exterior surfaces of the fourth opening and the fifth opening and a conductive material on the dielectric layer and filling the fourth opening and the fifth opening;
   selectively removing a portion of the fourth semiconductor material in the outer portions to below a top surface of the top layer of the first semiconductor material of the multilayer stack structure;
   selectively removing a portion of the conductive material to below the top surface of the top layer of the first semiconductor material of the multilayer stack structure thereby exposing the dielectric layer;
   removing the exposed dielectric layer; and
   depositing an oxide on the fourth semiconductor material in the outer portions and on the conductive material in the central portion to below a top surface of the semiconductor layer.

3. The method of claim 1, wherein the first semiconductor material is different than the fourth semiconductor material.

4. The method of claim 3, wherein the first semiconductor material comprises a doped epitaxial silicon material and the fourth semiconductor material comprises one of a doped single crystalline silicon material, a doped polysilicon material and an amorphous silicon material.

5. The method of claim 4, wherein the doped epitaxial silicon material is a p-doped silicon material.

6. The method of claim 2, wherein the dielectric layer comprises a high k dielectric material and the conductive material comprises a doped polysilicon.

7. The method of claim 2, wherein the step of selectively removing the fourth semiconductor material in the central portion comprises:
   depositing a block mask on a top surface of the outer portions and on a portion of the hard mask leaving an opening exposing a top surface of the central portion and a portion of the hard mask adjacent the central portion; and
   selectively etching the fourth semiconductor material in the central portion to expose the exterior surfaces of the alternating layers of the first semiconductor material and the second semiconductor material, the semiconductor layer and the hard mask and a top surface of the semiconductor substrate.

8. The method of claim 2, wherein the step of removing the exposed dielectric layer comprises isotropically etching the dielectric layer.

9. The method of claim 2, wherein the oxides formed on the fourth semiconductor material in the outer portions and on the conductive material in the central portion are coplanar.

10. The method of claim 2, wherein the oxides are shallow trench isolation oxides.

11. The method of claim 1, wherein forming the one or more semiconductor devices comprises forming a vertical transport field effect transistor on the decoupling capacitor.

12. The method of claim 1, wherein the active region comprises a semiconductor layer.

13. The method of claim 12, wherein the step of forming the one or more semiconductor devices on the active region of the decoupling capacitor comprises forming a bottom source/drain region on the semiconductor layer.

14. The method of claim 13, further comprising forming a bottom spacer layer on the bottom source/drain region.

15. The method of claim 14, further comprising forming a gate dielectric layer on the bottom spacer layer and forming a metal gate stack on the gate dielectric layer.

16. The method of claim 15, wherein the metal gate stack comprises a P-metal.

17. The method of claim 15, wherein the metal gate stack comprises an N-metal.

18. The method of claim 15, further comprising forming a top spacer layer on the metal gate and forming a top source/drain region of the top spacer layer.

19. The method of claim 18, further comprising forming one or more of a metal gate contact, a top source/drain contact and a bottom source/drain contact.

20. The method of claim 1, wherein the semiconductor substrate comprises silicon.

* * * * *